United States Patent [19]
Glenn

[11] Patent Number: 5,939,784
[45] Date of Patent: Aug. 17, 1999

[54] SHIELDED SURFACE ACOUSTICAL WAVE PACKAGE

[75] Inventor: Thomas P. Glenn, Gilbert, Ariz.

[73] Assignee: Amkor Technology, Inc., Chandler, Ariz.

[21] Appl. No.: 08/925,915

[22] Filed: Sep. 9, 1997

[51] Int. Cl.⁶ .................................................. H01L 23/10
[52] U.S. Cl. ........................................ 257/710; 257/678
[58] Field of Search .................................. 257/710, 658, 257/678, 693, 690; 361/679

[56] References Cited

U.S. PATENT DOCUMENTS

| | | | |
|---|---|---|---|
| 4,691,225 | 9/1987 | Murakami et al. | 257/693 |
| 4,993,000 | 2/1991 | Niitsuma et al. | 367/140 |
| 5,075,652 | 12/1991 | Sugai | 333/193 |
| 5,216,278 | 6/1993 | Lin et al. | 257/734 |
| 5,394,011 | 2/1995 | Yamamoto et al. | 257/693 |
| 5,629,835 | 5/1997 | Mahulikar et al. | 257/709 |

FOREIGN PATENT DOCUMENTS

| | | |
|---|---|---|
| 0 342 390 A1 | 11/1989 | European Pat. Off. . |
| 0 637 871 A1 | 2/1995 | European Pat. Off. . |
| 0 735 671 A1 | 10/1996 | European Pat. Off. . |

*Primary Examiner*—Olik Chaudhuri
*Assistant Examiner*—Nathan K. Kelley
*Attorney, Agent, or Firm*—Skjerven, Morrill, MacPherson, Franklin & Friel LLP

[57] ABSTRACT

A package for surface acoustical wave (SAW) device includes an electrically insulative substrate having a first surface with an electrically conductive layer formed thereon. A first surface of the SAW device is attached to the electrically conductive layer. An electrically conductive adhesive bead overlies the substrate first surface and surrounds the SAW device. An electrically conductive lid defines a free space over a second surface of the SAW device, the lid being electrically connected to the electrically conductive layer by the adhesive bead and one or more tabs extending from the lid through the adhesive bead to the electrically conductive layer. The electrically conductive adhesive bead, electrically conductive layer and electrically conductive lid enclose and shield the SAW device.

18 Claims, 4 Drawing Sheets

… (1)

SHIELDED SURFACE ACOUSTICAL WAVE PACKAGE

FIELD OF THE INVENTION

The present invention relates to the art of electronic packaging and more particularly to a method of packaging a surface acoustical wave device and the resulting structure.

BACKGROUND OF THE INVENTION

Surface acoustical wave (SAW) devices are piezoelectric electronic components which traditionally are used as narrow band frequency filters, e.g., frequency determining elements in high frequency control applications. During use, an acoustical wave is propagated across the surface of the SAW device.

As is well known to those skilled in the art, to prevent disruption of the acoustical wave, the package for the SAW device (the SAW package) must not contact the propagating surface of the SAW device, i.e. the SAW device must be packaged so that a free space exists over the propagating surface of the SAW device.

One conventional package for a SAW device seals the SAW device in resin leaving an air gap over the propagating surface of the SAW device. However, the use of a resin mold is relatively complex process which increases the cost of the SAW package. Further, as the resin cures air escaping from the air gap passes through the resin forming apertures in the resin. These apertures allow moisture from the ambient environment to enter the SAW package thereby degrading reliability of the SAW package.

One desirable characteristic of a SAW package is the ability to shield the SAW device. Shielding the SAW device prevents radiation emanating from the SAW device from interfering with adjacent electronic components and also prevents radiation from adjacent electronic components from interfering with the SAW device. Shielding the SAW device becomes increasingly important as electronic systems decrease in size and the spacing between SAW devices and other electronic components is reduced.

Accordingly, the art needs a SAW package which does not involve resin molding and which can be fabricated at a low cost. Further, it is desirable that the SAW package prevents the SAW device from emanating or receiving radiation.

SUMMARY OF THE INVENTION

In accordance with the invention, a package for an electronic device such as a surface acoustical wave (SAW) device includes an electrically insulative substrate. A first surface of the electronic device is attached to a first surface of the substrate and an electrically conductive layer contacts the substrate. An electrically conductive adhesive bead overlies the first surface of the substrate and surrounds the electronic device. An electrically conductive lid defines a free space over a second surface of the electronic device, the lid being electrically connected to the electrically conductive layer by the adhesive bead. In one embodiment, the lid has one or more electrically conductive tabs which pass through the adhesive bead.

The electrically conductive adhesive bead, electrically conductive layer and electrically conductive lid form an electrically conductive structure (a faraday shield) which surrounds and shields the electronic device. This is particularly advantageous in miniaturized electronic systems in which the electronic device package is located near other electronic devices.

In addition to bonding the electrically conductive lid to the substrate and enhancing the electrical connection between the lid and the electrically conductive layer, the adhesive bead forms a seal between the lid and the substrate. The enclosure around the electronic device formed by the substrate, adhesive bead and lid protects the electronic device from the ambient environment (e.g. moisture) and the associated corrosive effects.

In accordance with the invention, a method of packaging an electronic device includes providing an electrically insulative substrate having a first surface and mounting a first surface of the electronic device on the first surface of the substrate. Bond pads on a second surface of the electronic device are then electrically connected to metallizations on the first surface of the substrate. An electrically conductive adhesive bead is then applied overlying the first surface of the substrate and surrounding the electronic device. An electrically conductive lid is then placed on the adhesive bead, the electrically conductive lid defining a free space over the second surface of the electronic device.

These and other objects, features and advantages of the present invention will be more readily apparent from the detailed description of the preferred embodiments set forth below taken in conjunction with the accompanying drawings.

DESCRIPTION OF THE PREFERRED EMBODIMENTS

Several elements shown in the following figures are substantially similar. Therefore, similar reference number are used to represent similar elements.

Figure 1:
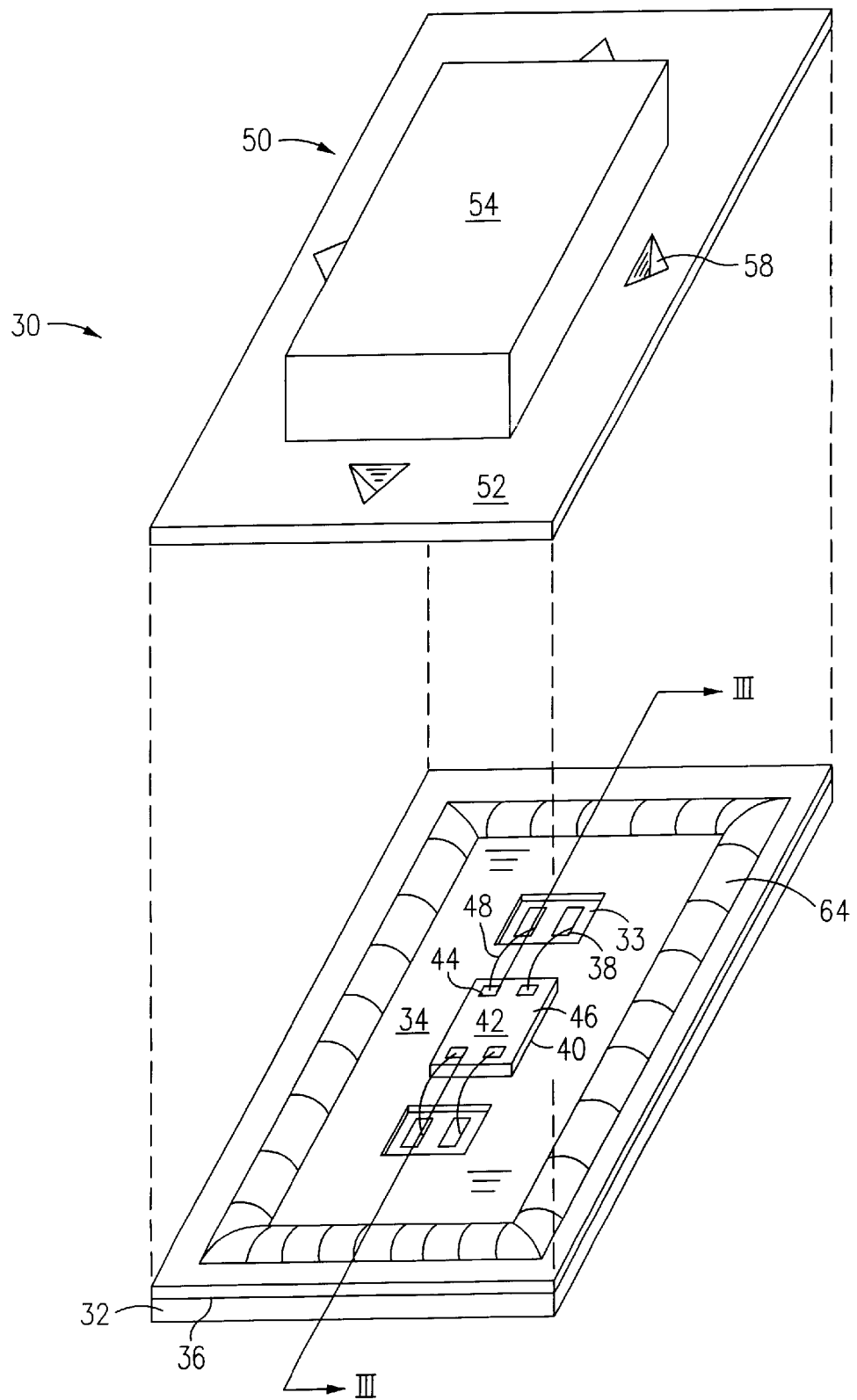
FIG. 1 is a partially exploded perspective view of a SAW package in accordance with the present invention.

FIG. 1 is a partially exploded perspective view of a surface acoustical wave (SAW) package 30 in accordance with the present invention. As shown in FIG. 1, SAW package 30 includes an electrically insulative substrate 32 having an electrically conductive ground plane 34 formed on a first surface 36 of substrate 32. Ground plane 34 has one or more apertures 33 formed therein in which electrically conductive metallizations/traces 38 (hereinafter traces 38) are formed on first surface 36 of substrate 32. Traces 38 are electrically isolated from ground plane 34.

A first surface 40 of a SAW device 42 is attached to ground plane 34, e.g. with adhesive, and is thereby attached to first surface 36 of substrate 32. Bond pads 44 on a second surface 46 of SAW device 42 are electrically connected to respective traces 38 by bond wires 48. Bond pads 44 are electrically connected to the internal circuity (not shown) of SAW device 42.

SAW package 30 further includes an electrically conductive lid 50, e.g. formed of nickel, gold plated nickel, stainless steel, gold plated copper, nickel plated copper, or aluminum. Lid 50 includes a base section 52 integrally connected to a raised section 54. Raised section 54 defines a free space in which SAW device 42 is located. Base section 52 includes one or more apertures 58 formed by punching base section 52.

Figure 2:
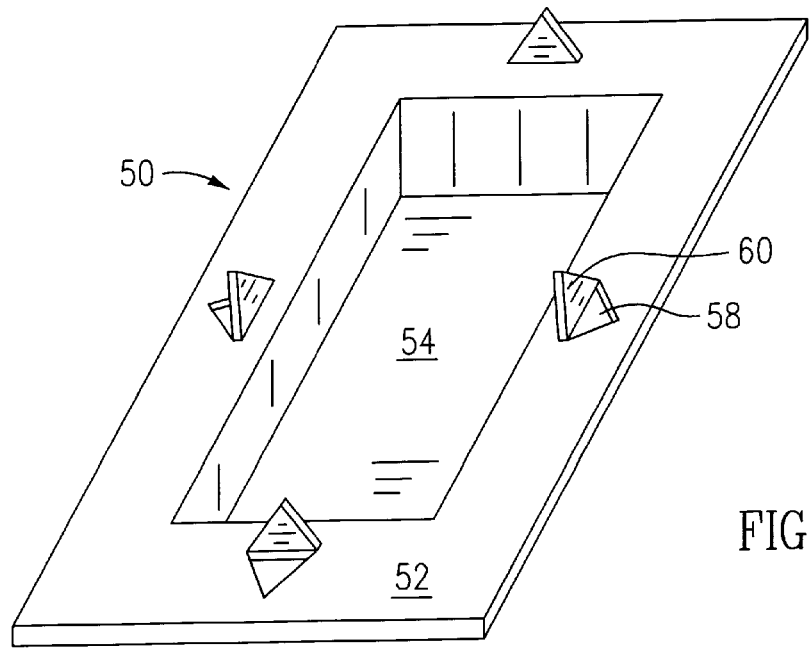
FIG. 2 is a bottom perspective view of a lid of the SAW package of FIG. 1 in accordance with the present invention.

FIG. 2 is a bottom perspective view of lid 50. As shown in FIG. 2, each aperture 58 corresponds to an electrically conductive tab 60 which extends orthogonally from base section 52. Tabs 60 are triangular in shape with the bent base of each triangle being located at base section 52 and the apex of each triangle pointing away from base section 52. Of importance, tabs 60 are formed to a point (the triangle apex). Referring again to FIG. 1 the points of tabs 60 (not shown) pierce into and may pass through ground plane 34 and form an electrical connection between lid 50 and ground plane 34 as describe in more detail below. Lid 50 is secured to ground plane 34 and substrate 32 by an electrically conductive adhesive bead 64 which fills apertures 58 and surrounds SAW device 42. Examples of electrically conductive adhesives include carbon-filled epoxy, silver-filled epoxy and copper-filled epoxy. Since adhesive bead 64 is electrically conductive and contacts ground plane 34 and lid 50 it further ensures electrical connection between lid 50 and ground plane 34.

Figure 3:
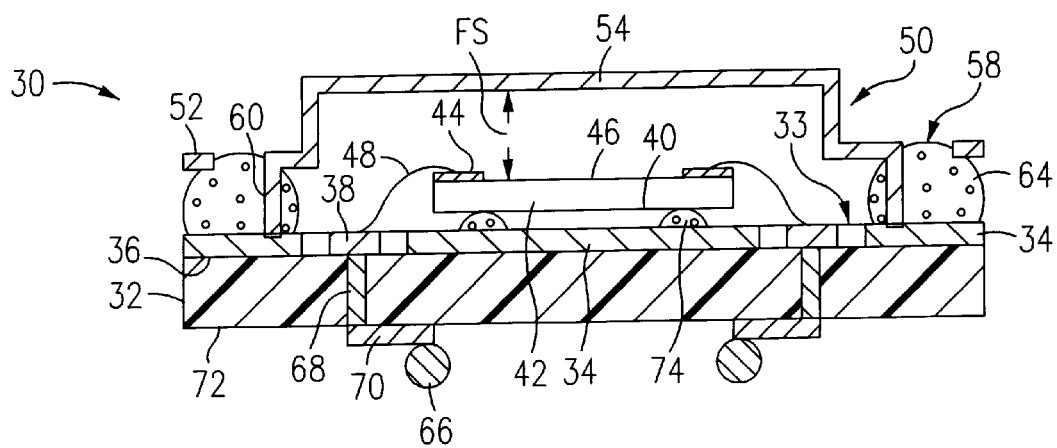
FIG. 3 is a cross-sectional view of the assembled SAW package along the line III—III of FIG. 1 in accordance with the present invention.

FIG. 3 is a cross-sectional view of assembled SAW package 30 along the line III—III of FIG. 1. As shown in FIG. 3, first surface 40 of SAW device 42 is bonded to ground plane 34 and thereby to first surface 36 of substrate 32 with an adhesive bead 74 of an electrically insulating RTV die attach adhesive or other suitable material.

As further shown in FIG. 3, traces 38 are electrically connected to interconnect balls 66. Interconnect balls 66 can be arranged in an array, for example to form a ball grid array (BGA). Alternatively; interconnect balls 66 can be arranged near the perimeter of substrate 32. Interconnect balls 66 allow electrical interconnection between SAW package 30 and other electrical components (not shown).

Each trace 38 is electrically connected to an interconnect ball 66 by an electrically conductive pathway formed by an electrically conductive via 68 and metallization/trace 70 (hereinafter trace 70). Vias 68 extend from traces 38 on first surface 36 of substrate 32 to traces 70 on a second surface 72 of substrate 32. Alternatively, interconnect balls 66 are directly connected to the ends of vias 68 and traces 70 are not formed. In other alternatives, substrate 32 is a multilayered laminate substrate having a plurality of electrically conductive vias electrically connecting conductive traces formed on various layers as is well known to those skilled in the art.

Further, a conventional electrically insulative solder mask (not shown) can be applied on portions of traces 38 and/or traces 70 to increase reliability of SAW package 30, i.e to prevent shorting of traces 38 and/or traces 70 with other electrically conductive structures. In one embodiment (not shown), a solder mask is applied on portions of traces 38 which extend under adhesive bead 64 to the periphery of substrate 32. (In this embodiment, apertures 33 in ground plane 34 extend to the periphery of substrate 32, tabs 60 are located so as to avoid contact with traces 38 which pass between tabs 60 and vias 68 are located near the periphery of substrate 32.)

In addition to bonding lid 50 to substrate 32 (ground plane 34) and enhancing the electrical connection between lid 50 and ground plane 34, adhesive bead 64 forms a seal between lid 50 and substrate 32 (ground plane 34). More particularly, adhesive bead 64 forms a seal between base section 52 of lid 50 and ground plane 34. The enclosure formed by substrate 32, adhesive bead 64 and lid 50 protects SAW device 43 from the ambient environment (e.g. moisture) and the associated corrosive effects.

Extending through adhesive bead 64 to ground plane 34 are tabs 60. The points of tabs 60 pierce ground plane 34 forming an electrical connection between lid 50 and ground plane 34. Thus, SAW device 42 is enclosed by an electrically conductive structure (a faraday shield) of a common electrical potential formed by lid 50, ground plane 34 and adhesive bead 64. This electrically conductive structure can be electrically connected to one or more interconnect balls 66 designated as ground by appropriate vias and traces. By enclosing SAW device 42 in this electrically conductive structure, radiation (e.g. electromagnetic radiation including radio frequency (RF) radiation) emanating from SAW device 42 is essentially prevented from leaving SAW package 30 and SAW device 42 is essentially shielded from all external radiation. This is particularly advantageous in miniaturized electronic systems in which SAW package 30 is located near other electronic devices and in outer space applications.

Further, lid 50 and more particularly, raised section 54 of lid 50 defines a cavity or free space FS in which SAW device 42 is located. Of importance, the distance between raised section 54 and base section 52 of lid 50, i.e. the depth of the cavity defined by raised section 54, must be sufficient to prevent contact between second surface 46 of SAW device 42 and lid 50. Since it is relatively simple to ensure that this distance is sufficient, lid 50 provides a simple and cost effective means of providing a free space FS above the propagating surface (i.e. second surface 46) of SAW device 42 compared to the prior art.

Figure 4:
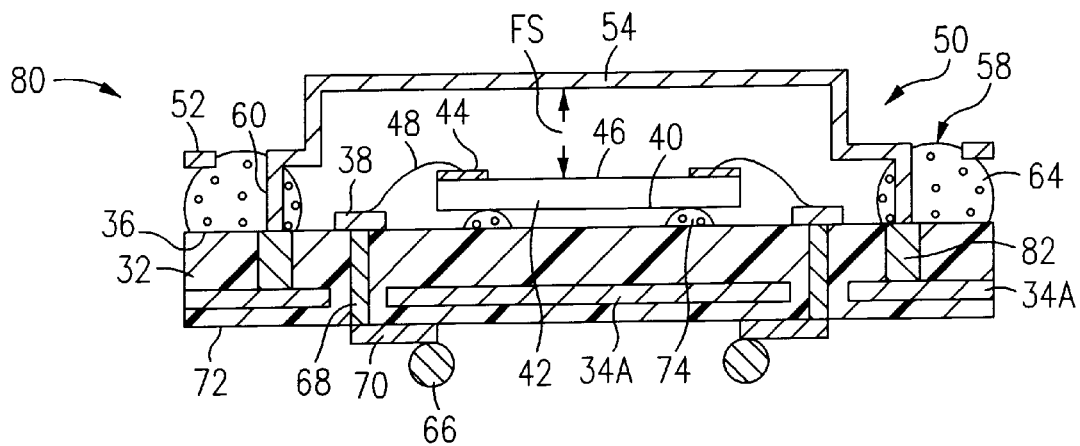
FIG. 4 is a cross-sectional view of a SAW package in accordance with an alternative embodiment of the present invention.

FIG. 4 is a cross-sectional view of a SAW package 80 in accordance with an alternative embodiment of the present invention. SAW package 80 is substantially similar to SAW package 30 of FIG. 3 except that ground plane 34 (FIG. 3) is formed as an interlayer metallization (ground plane 34A in FIG. 4) of substrate 32 and is electrically connected to lid 50 by one or more electrically conductive vias 82.

More particularly, in this embodiment, ground plane 34A is located between first and second surfaces 36, 72 of substrate 32. Vias 82 extend from ground plane 34A to first surface 36 of substrate 32. Tabs 60 pierce vias 82 thereby forming an electrical connection between lid 50 and ground plane 34A. Electrically conductive adhesive bead 64 contacts lid 50 and any portions of vias 82 exposed thus further enhancing the electrical connection between lid 50 and ground plane 34. Alternatively, vias 82 are electrically connected to traces (not shown) on first surface 36 of substrate 32. Tabs 60 pierce these traces and adhesive bead 64 contacts these traces thereby forming the electrical connection between lid 50 and ground plane 34. Ground plane 34 is patterned to prevent contact between ground plane 34 and vias 68.

Figure 5:
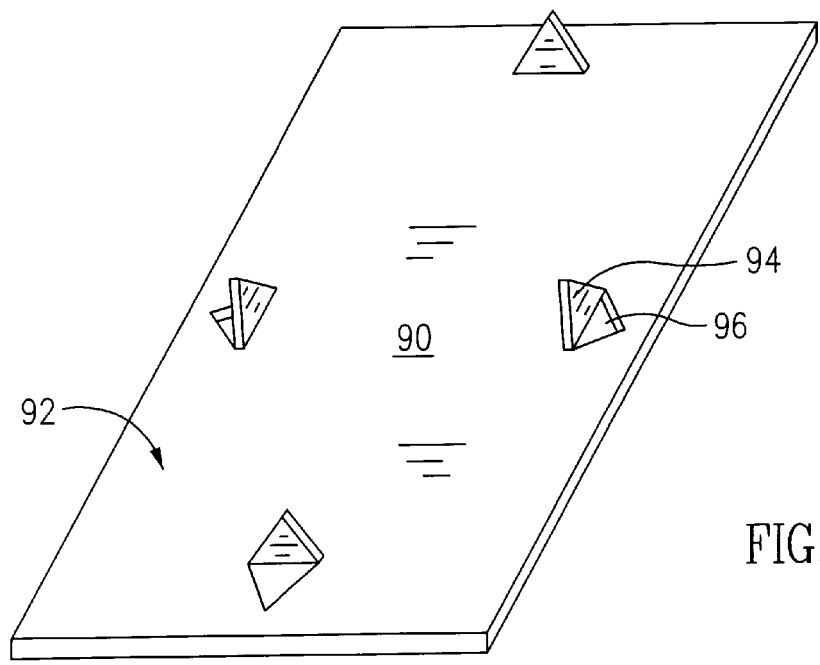
FIG. 5 is a bottom perspective view of a planar sheet lid for use in a SAW package in accordance with an alternative embodiment of the present invention.

FIG. 5 is a bottom perspective view of a planar sheet lid 90 for use in a SAW package in accordance with an alternative embodiment of the present invention. Lid 90 is formed of an electrically conductive material. Projecting from surface 92 of lid 90 are one or more tabs 94. Tabs 94 are formed i.e. bent by punching lid 90 with a diamond shaped punch excising the two sides of a triangular tab. Tabs 94 are triangular in shape with the bent base of each triangle being located at surface 92 of lid 90 and the apex of each triangle pointing away from surface 92 of lid 90. Punching lid 90 also forms apertures 96 each of which corresponds to the shape of a bent tab 94.

Figure 6:
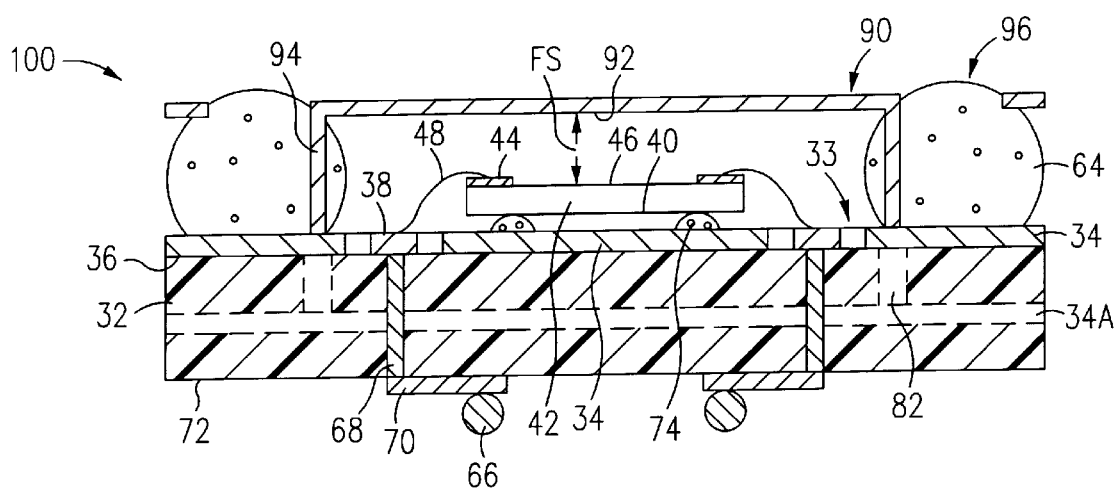
FIG. 6 is a cross-sectional view of a SAW package incorporating the planar sheet lid of FIG. 5 in accordance with the present invention.

FIG. 6 is a cross-sectional view of a SAW package 100 incorporating planar sheet lid 90 of FIG. 5 in accordance with the present invention. As shown in FIG. 6, tabs 94 extend to and pierce ground plane 34 located on first surface 36 of substrate 32 to form an electrical connection between lid 90 and ground plane 34. Electrically conductive adhesive bead 64 contacts lid 90 and ground plane 34 thus enhancing this electrical connection. Further, the length of tabs 94 (i.e. the distance between the apex of the tabs and surface 92 of lid 90) define the distance between surface 92 of lid 90 and ground plane 34 (first surface 36 of substrate 32). Of importance, tabs 94 must have a length sufficient to prevent contact between lid 90 and second surface 46 of SAW device 42.

Tabs 94 extend through adhesive bead 64 which mounts lid 90 to substrate 32 and ground plane 34. Adhesive bead 64 also fills apertures 96 in lid 90 and forms a seal between lid 90 and substrate 32 (ground plane 34).

In an alternative embodiment, instead of locating ground plane 34 on first surface 36 of substrate 32 as illustrated in FIG. 6, ground plane 34 is located as an interlayer metallization (ground plane 34A indicated by dashed lines) between first and second surfaces 36, 72 of substrate 32. Electrically conductive vias (vias 82 indicated by dashed lines) or electrically conductive vias in combination with electrically conductive traces on first surface 36 of substrate 32 (not shown) electrically connect ground plane 34A to lid 90 in this embodiment.

Figure 7:
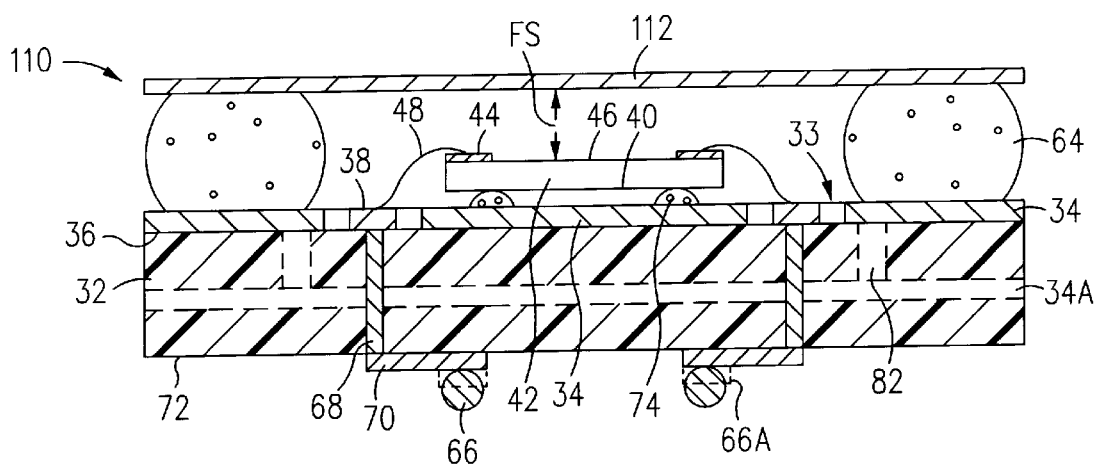
FIG. 7 is a cross-sectional view of a SAW package in accordance with an alternative embodiment of the present invention.

FIG. 7 is a cross-sectional view of a SAW package 110 in accordance with an alternative embodiment of the present invention. SAW package 110 is substantially similar to SAW package 100 of FIG. 6 except that SAW package 110 is formed with a lid 112 (FIG. 7) having an absence of tabs 94 and corresponding apertures 96 (FIGS. 5, 6). More particularly, lid 112 is a planar sheet of electrically conductive material. In this embodiment, electrically conductive adhesive bead 64 forms the electrical connection between lid 112 and ground plane 34 (or alternatively vias 82 extending to ground plane 34A indicated by the dashed lines).

In other alternative embodiments, lid 50 (FIGS. 1, 2, 3 and 4) is formed with an absence of tabs 60 and apertures 58. In these alternatives, electrically conductive adhesive bead 64 forms the electrical connection between lid 50 and ground plane 34 (FIG. 3) or lid 50 and vias 82 (FIG. 4).

Referring again to FIG. 3, to fabricate SAW package 30, lid 50 is formed using conventional techniques such as stamping. Substrate 32 including ground plane 34, traces 38, vias 68 and traces 70 is also formed using conventional techniques. Adhesive bead 74 is then applied using conventional techniques to first surface 36 of substrate 32 (ground plane 34). First surface 40 of SAW device 42 is then placed in contact with adhesive bead 74. Alternatively, adhesive bead 74 is applied to first surface 40 of SAW device 42 which is then placed on first surface 36 of substrate 32 (ground plane 34). After adhesive bead 74 is cured, bond pads 44 are wirebonded to traces 38 by bondwires 48 using conventional techniques.

Adhesive bead 64 is then applied, for example using a syringe, to the first surface 36 of substrate 32 (ground plane 34) adjacent the periphery of substrate 32 and surrounding SAW device 42. Lid 50 is then placed on adhesive bead 64 and pressed towards substrate 32 thereby passing tabs 60 through adhesive bead 64 and into ground plane 34. Adhesive bead 64 is then cured. Interconnect balls 66 are then formed using conventional techniques on traces 70 (or at the end of vias 68 if traces 70 are not formed) to complete fabrication of SAW package 30. SAW package 80, 100 of FIGS. 4, 6, respectively, are fabricated using similar techniques. SAW package 110 of FIG. 7 is also fabricated using similar techniques except that the force exerted on lid 112 must be accurately controlled to prevent lid 112 from being pressed into contact with SAW device 42.

Although the present invention has been described with reference to preferred embodiments, persons skilled in the art will recognize that changes may be made in form and detail without departing from the spirit and scope of the invention. For example, tabs 94 (FIGS. 5, 6) and tabs 60 (FIGS. 2, 3, 4) are described and illustrated as tapering to a sharp point but can have any shape which facilitates electrically connection with ground plane 34. Further, although interconnect balls 66 (FIGS. 3, 4, 6 and 7) are described, interconnect pads (e.g. interconnect pads 66A indicated by dashed lines in FIG. 7) instead of interconnect balls can be used. Further, other electronic devices besides a surface acoustical wave device can be packaged in accordance with the present invention, for example any electronic device where shielding is desirable such as RF transistors and RF integrated circuits. Thus the invention is limited only by the following claims.

I claim:

1. A package for an electronic device comprising:
   an electrically insulative substrate, a first surface of said electronic device being attached to a first surface of said substrate;
   an electrically conductive layer contacting said substrate;
   an electrically conductive adhesive bead overlying said first surface of said substrate, said adhesive bead surrounding said electronic device; and
   an electrically conductive lid defiling a free space over a second surface of said electronic device, said lid being electrically connected to said electrically conductive layer by said adhesive bead, wherein said lid has one or more tabs passing through said adhesive bead, said one or more tabs being electrically conductive.

2. The package of claim 1 wherein said electrically conductive layer is formed on said first surface of said substrate, said one or more tabs piercing said electrically conductive layer.

3. The package of claim 1 wherein said electrically conductive layer is an interlayer of said substrate, said package further comprising one or more electrically conductive vias extending from said electrically conductive layer to said first surface of said substrate.

4. The package of claim 3 wherein said one or more tabs pierce said one or more electrically conductive vias.

5. The package of claim 3 further comprising one or more first metallizations formed on said first surface of said substrate electrically connected to said one or more electrically conductive vias, wherein said one or more tabs pierce said first metallizations.

6. The package of claim 1 wherein said one or more tabs are formed to a point.

7. The package of claim 1 wherein said one or more tabs are triangular in shape having an apex pointing away from said lid.

8. The package of claim 1 wherein said second surface of said electronic device has one or more bond pads formed thereon, said package further comprising one or more interconnect balls formed on a second surface of said substrate, said one or more bond pads being electrically connected to corresponding ones of said one or more interconnect balls.

9. The package of claim 1 wherein said second surface of said electronic device has one or more bond pads formed thereon, said package further comprising one or more interconnect pads formed on a second surface of said substrate, said one or more bond pads being electrically connected to corresponding ones of said one or more interconnect pads.

10. The package of claim 1 wherein said lid, said electrically conductive layer and said adhesive bead form an electrically conductive structure which shields said electronic device from radiation.

11. The package of claim 1 wherein said lid comprises a raised section integrally connected to a base section.

12. The package of claim 1 wherein said adhesive bead, said lid and said substrate form an enclosure which protect said electronic device from the ambient environment.

13. The package of claim 1 wherein said lid comprises a planar sheet of electrically conductive material.

14. The package of claim 1 wherein said electronic device is a surface acoustical wave device.

15. The package of claim 1 wherein said electrically conductive adhesive bead is selected from the group consisting of carbon-filled epoxy, silver-filled epoxy and copper-filled epoxy.

16. The package of claim 1 wherein said electrically conductive adhesive bead is applied using a syringe.

17. The package of claim 1 wherein said first surface of said electronic device is attached to said electrically conductive layer and thereby to said first surface of said substrate.

18. A package for an electronic device comprising:

an electrically insulative substrate, a first surface of said electronic device being attached to a first surface of said substrate;

an electrically conductive layer contacting said substrate;

an electrically conductive adhesive bead overlying said first surface of said substrate, said adhesive bead surrounding said electronic device; and an electrically conductive lid defining a free space over a second surface of said electronic device, said lid being electrically connected to said electrically conductive layer by said adhesive bead, wherein said lid comprises a raised section integrally connected to a base section and one or more tabs extend from said base section of said lid.

* * * * *